(12) United States Patent
Prater

(10) Patent No.: US 6,958,720 B1
(45) Date of Patent: Oct. 25, 2005

(54) FINE STRING COMPENSATION TO MINIMIZE DIGITAL TO ANALOG CONVERTER DIFFERENTIAL NONLINEARITY ERROR

(75) Inventor: James S. Prater, Fort Collins, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/830,586

(22) Filed: Apr. 22, 2004

(51) Int. Cl.[7] .................................. H03M 1/68
(52) U.S. Cl. ........................ 341/145; 341/154
(58) Field of Search ................. 341/145, 154

(56) References Cited

U.S. PATENT DOCUMENTS 4,150,366 A * 4/1979 Price .......................... 341/154
5,111,205 A * 5/1992 Morlon ....................... 341/145
5,252,975 A * 10/1993 Yuasa et al. ................ 341/145
5,969,657 A * 10/1999 Dempsey et al. ........... 341/145

OTHER PUBLICATIONS

Post et al.; A 14 Bit Monotonic NMOS D/A Converter; Jun. 1983; IEEE Journal of Solid-State Circuits, vol. SC-18, No. 3; pp. 297-301.*
Roubik Gregorian, "Introduction to CMOS OP-AMPS and Comparators," pp. 218-231, A Wiley-Interscience Publication 1999, no month.

* cited by examiner

Primary Examiner—Howard L. Williams
(74) Attorney, Agent, or Firm—Cochran Freund & Young LLC; William W. Cochran

(57) ABSTRACT

Disclosed is a process for minimizing digital-to-analog converter differential nonlinearity by adjusting taps in resistive elements in a fine resistor string voltage divider circuit. Active buffer circuits can be eliminated while still minimizing DAC DNL and insuring circuit monoticity.

18 Claims, 11 Drawing Sheets

FINE STRING COMPENSATION TO MINIMIZE DIGITAL TO ANALOG CONVERTER DIFFERENTIAL NONLINEARITY ERROR

BACKGROUND OF THE INVENTION a. Field of the Invention

The present invention pertains generally to digital-to-analog converters (DACs) and more particularly to two-stage non-buffered resistive string DACs.

b. Description of the Background

Two-stage resistor string DACs have been used to reduce the complexity of single-stage DACs including the number of resistors, the number of switches and the associated switching control circuitry. For example, single stage DACs for converting an N-bit digital signal require $2^N$ resistors and $2^{N-1}+2$ switches. Active components such as unity gain operational amplifiers can be used between the two stages of a two-stage resistor string DAC to provide isolation between the resistor strings. More specifically, unity gain operational amplifiers have extremely high input impedance that provide isolation between the two stages of resistor strings. Although buffered two-stage resistor string DACs greatly reduce the complexity and the number of components required, the use of active components, as described above, requires that these circuits be active circuits, rather than simply passive circuits. Many present day applications require that circuits be passive and not consume power. For example, many battery-operated circuits, such as circuits in cell phones, PDAs, etc., must minimize the consumption of power. Elimination of the active buffers in a two-stage resistive string DAC degrades the performance of the DAC with respect to both the integral nonlinearity (INL) and differential nonlinearity (DNL).

SUMMARY OF THE INVENTION

Embodiments of the present invention overcome disadvantages and limitations of the prior art by providing fine string compensation in a non-buffered two-stage resistive series DAC.

An embodiment of the present invention may therefore comprise a method of converting a digital code to an analog signal comprising providing a two-stage resistor divider circuit having a coarse resistor string and a fine resistor string; tapping the fine resistor string in at least one position on the fine resistor string that provides compensation for resistive loading created by connecting the fine resistor string in parallel with at least one resistor in the coarse resistor string.

An embodiment of the present invention may further comprise a digital-to-analog converter that reduces differential non-linearity comprising a coarse resistor string, connected between two potential voltages, having a plurality of coarse resistors; a fine resistor string; a plurality of switches that connect the fine resistor string in parallel with at least one coarse resistor of the plurality of coarse resistors; a tap that connects to a fine resistor of the plurality of fine resistors in a position that provides compensation for resistive loading created by connecting the fine resistor string in parallel with the at least one coarse resistor.

Advantages of various embodiments of the present invention include the ability to distribute differential nonlinearity created in non-buffered two-stage or multi-stage resistor string digital-to-analog converters. Distribution of DNL created by resistor loading is accomplished by progressive tapping of resistor elements in the fine resistor string.

DETAILED DESCRIPTION OF THE INVENTION

Figure 1:
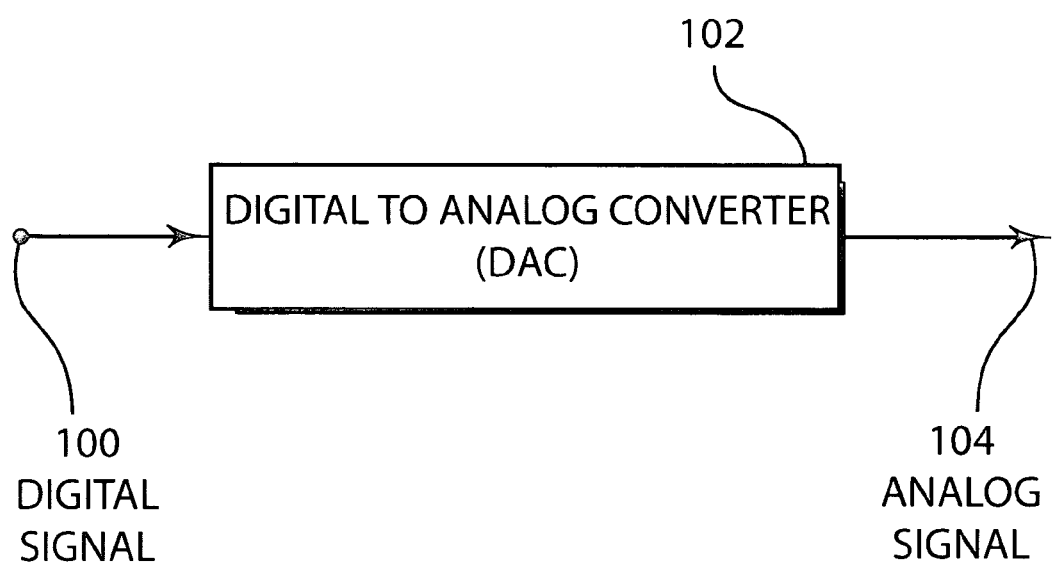
FIG. 1 is a block diagram illustrating a digital-to-analog converter of the present invention.

FIG. 1 is a block diagram of the present invention. As shown in FIG. 1, a digital signal 100 is applied to the digital-to-analog converter (DAC) 102 which creates an analog signal 104 that is representative of the digital signal 100. The digital signal may have a different number of bits for each byte, such as 8-bit bytes, 12-bit bytes, 16-bit bytes, etc. The number of bits per byte is generally referred to as N. The digital signal 100 has one or more most significant bits (MSB) and one or more least significant bits (LSB). The digital signal is normally a binary code that represents an analog signal level which the DAC 102 creates as an analog output signal 104.

Figure 2A:
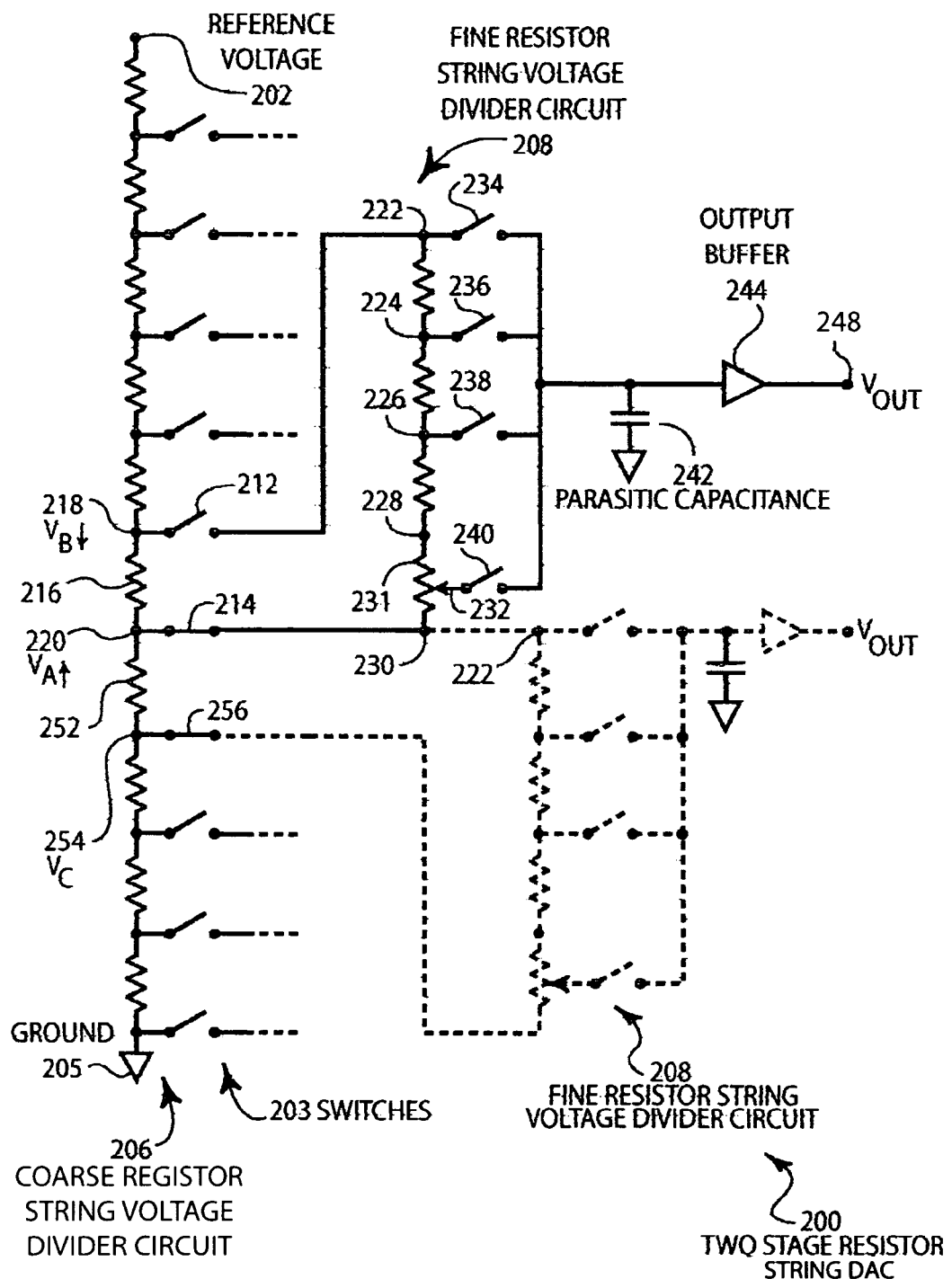
FIG. 2A is a schematic circuit diagram of one embodiment of the present invention in a first state.

FIG. 2A is a schematic circuit diagram of one embodiment of a two-stage resistive string DAC 200 that comprises an embodiment of the present invention. The two-stage resistive string DAC 200 includes a coarse resistor string voltage divider circuit 206 and a fine resistor string voltage divider circuit 208. The coarse resistor string voltage divider circuit 206 is connected between a reference voltage 202, and ground potential 205. One or more most significant bits of the digital code are used to select a resistor, such as resistor 216, in the coarse resistor string voltage divider circuit 206. In other words, the most significant bit or bits of a digital code are used to activate switches 203 to select a resistor in the coarse resistor string voltage divider circuit 206 to obtain a coarse voltage. The least significant bit or bits in the digital code are used to activate switches 234–240 to select a resistor in the fine resistor string voltage divider circuit 208 to provide a more accurate output voltage $V_{out}$ 248, at the output of output buffer 244 that is representative of the digital code of the digital signal 100.

The coarse resistor string voltage divider circuit 206, in this fashion, provides a series of coarse voltages along the resistor series string that can be selected by the switches 203 in response to the digital code. In FIG. 2, switches 212 and 214 are closed so as to select resistor 216 in the coarse resistor string voltage divider circuit 206. Voltage $V_B$ at node 218 is applied to node 222 at the top of the fine resistor string voltage divider circuit 208. Similarly, voltage $V_A$ at node 220 is applied to node 230 at the bottom of the fine resistor string voltage divider circuit 208. Applying the fine resistor string in parallel with resistor 216 causes the equivalent resistance of the parallel circuit to drop. Although the size of the resistors in the fine resistor string 208 can be made greater than the resistance of resistor 216, to minimize the drop in resistance, there is a limit as to how large the resistors can be made in the fine resistor string 208 due to a reduction in the speed of operation of the device, as the result of various parasitic capacitances that exist in the circuit, that are represented by capacitor 242. The lowering of the resistance of the circuit, comprising resistor 216 and the fine resistor string 208 in parallel, has previously been eliminated through the use of active isolation circuits such as described above. However, the elimination of the active circuits, results in the equivalent resistance of the parallel resistance circuits that is lower than the resistance of resistor 216.

Because the equivalent resistance across resistor 216 is lowered, the voltage $V_B$ at node 218 goes down and the voltage $V_A$ at node 220 goes up. This change in equivalent resistance affects the integral nonlinearity error (INL) and the differential nonlinearity error (DNL). The integral nonlinearity error is defined as the amount of deviation of the measured transfer function of a digital-to-analog converter (DAC) from the ideal transfer function (defined as a straight line drawn from 0 to full scale). The differential nonlinearity error (DNL) is defined as follows: Assuming an ideal digital-to-analog converter (DAC) with analog output values exactly one code apart (DNL error equal 0), the DNL error is defined as the difference between the ideal and the measured output value between successive DAC codes. In other words, in comparing successive voltage steps of the output analog signal, the difference between an ideal voltage step and the actual measured voltage step is defined as the DNL. Both INL and DNL are caused by a combination of random component variation and systematic circuit effects. Embodiments of the present invention address systematic circuit effects.

The fine resistor string 208 may include many resistors. For purposes of illustration, only four resistors have been shown in FIG. 2. As pointed out above, the purpose of the fine resistor string 208 is to obtain the analog voltage step that is represented by the digital code of the digital signal. Since $V_B$ at node 218 goes down and $V_A$ at node 220 goes up, the voltage at the center of the fine resistive string, such as at node 226, remains substantially constant. Hence, the INL at node 226 should be close to zero, aside from random variations of circuit elements. The INL at node 222 and node 230, without compensation, will have a non-zero magnitude because $V_B$ goes down and $V_A$ goes up as a result of the resistive parallel circuit. Similarly, the INL at nodes 224 and 228, without compensation, are greater than the INL at node 226 and less than the INL at nodes 222 and 230 without compensation. As can be seen, there is a progressive increase in the absolute value of INL moving either up or down from the center node 226 of the fine resistor string 208.

In most applications, these changes in INL are not significant because they represent a very small percentage change in the level of the overall output analog signal 104. However, these changes can significantly affect DNL. The largest DNL occurs between node 228 and node 230 when the compensation circuit of various embodiments of the present invention is not employed. As indicated above, the voltage at node 226 is approximately correct. However, the voltage at node 228 is higher than it should be because $V_A$ at node 220 goes up as a result of the fact that the equivalent resistance across resistor 216 goes down. The next lower voltage, which is the voltage at node 230, is obtained as shown in FIG. 2B.

Figure 2B:
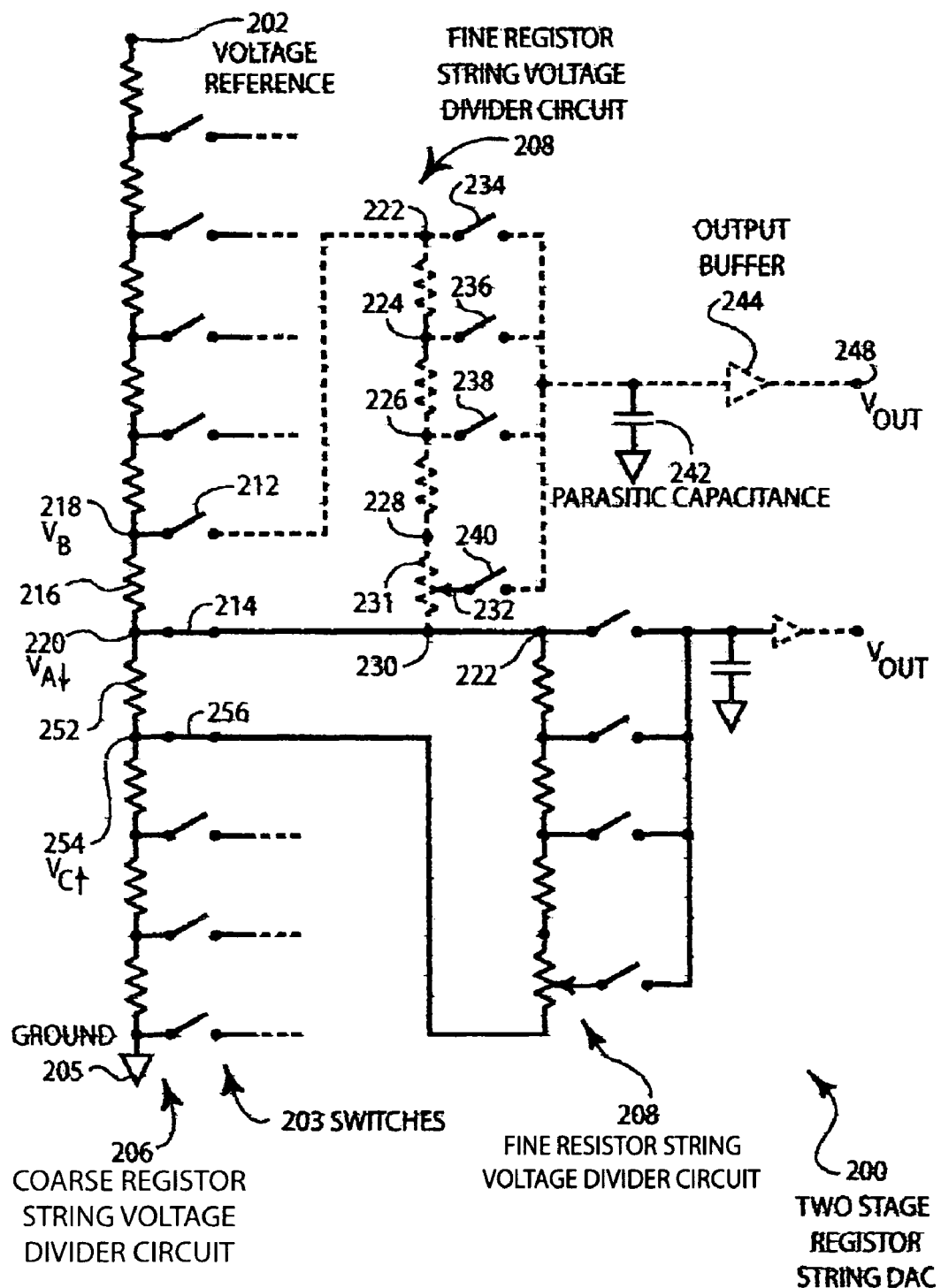
FIG. 2B is a schematic circuit diagram of the embodiment of FIG. 2A in a second state.

FIG. 2B illustrates the manner in which the voltage at node 230 is obtained. The voltage at node 230 is the next lower voltage step from the voltage at step 228. Switch 212 is open while switches 214 and 256 are closed so that the voltage across resistor 252 is applied across the fine resistive string 208. The voltage $V_A$ at node 220 then goes down while the voltage $V_C$ at node 254 goes up because of the smaller equivalent resistance between nodes 220 and 254. Hence, the voltage $V_A$ at node 230 and node 222 goes down. As indicated previously with respect to the description of FIG. 2A, the voltage at node 228 was higher than it would otherwise be because node 228 is below the center node 226. As can be seen from this example, the voltage at node 228 is higher than it should be in FIG. 2A, while the voltage at node 222 is lower than it should be in FIG. 2B, which increases the differential nonlinearity (DNL) between these steps.

Referring again to FIG. 2A, these problems may be overcome by providing compensation. As set forth above, the voltage at node 228 is higher than it should be. By tapping resistor 231 at a position that is partially down from node 228, the voltage at tap 232 is lower than the voltage at 228. In this manner, the additional resistance provided by a portion of resistor 231 compensates for the higher voltage at node 228 so that the voltage at tap 232 is approximately correct. By making the voltage at tap 232 approximately the right voltage, the difference between the voltage at tap 232, which is generated at the output 248 when switches 212, 214 and 240 are closed, is closer in value to the voltage at node 222 when switches 214, 256 and 258 are closed. In this fashion, the DNL between nodes 228 and 230 is substantially lessened. Note, however, that the DNL between nodes 226 and 232 increases by the same amount as the DNL between nodes 228 and 230 decreases. Hence, balancing of the amount of DNL between these various nodes allows the designer to achieve the desired results.

Figure 3A:
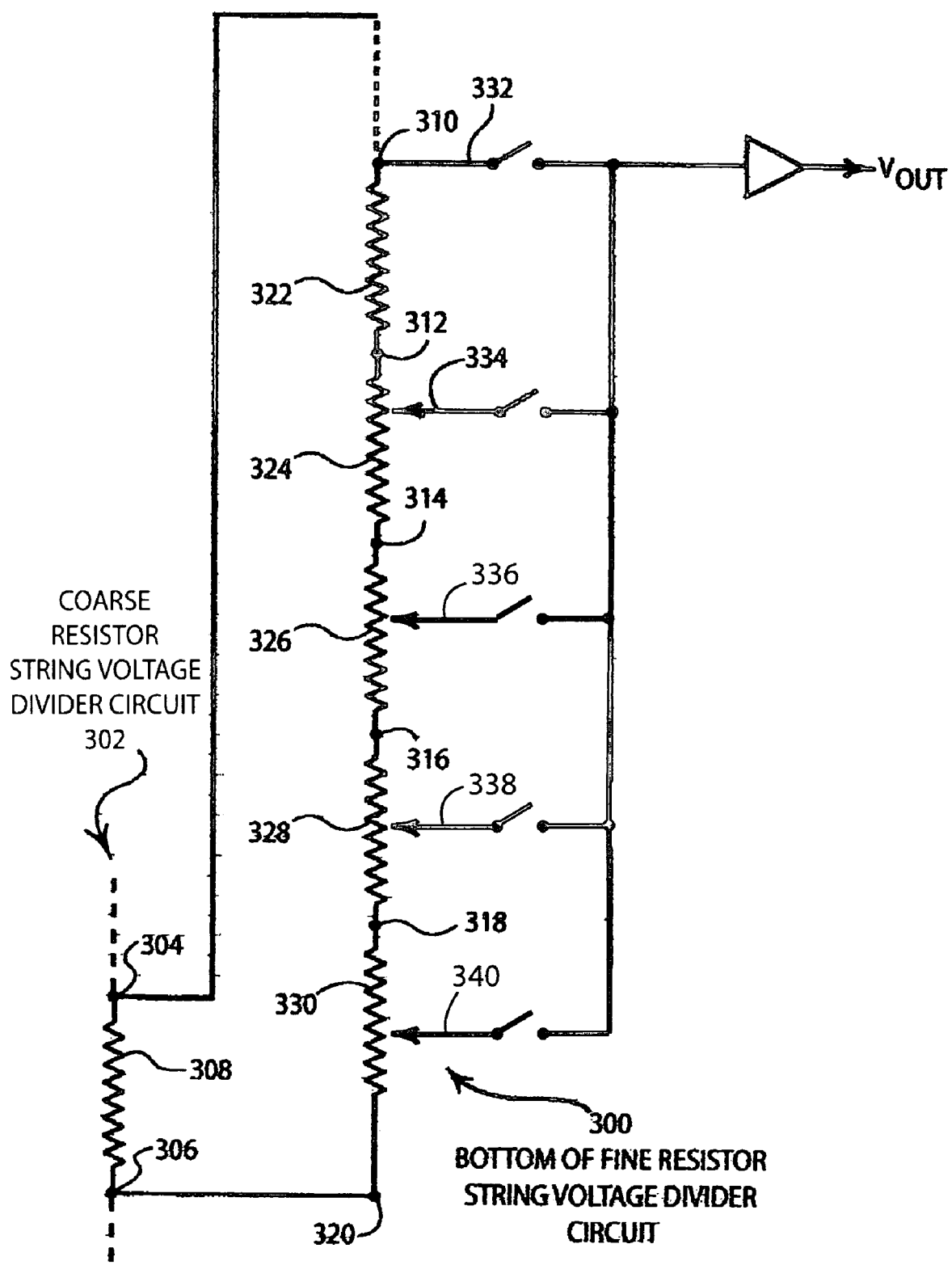
FIG. 3 is a schematic circuit diagram of another embodiment of the present invention.

While FIG. 2B shows compensation of a single resistor 231, FIG. 3A illustrates the manner in which progressive compensation can be accomplished with multiple resistors. As shown in FIG. 3A, the fine resistor string voltage divider circuit 300 includes multiple resistors. Resistors 322, 324, 326, 328 and 330 are at the lower end of the fine resistor string and additional resistors exist above node 310. In other words, FIG. 3A only shows the lower portion of the fine resistor string 300. The coarse resistor string voltage divider circuit 302 is only schematically shown with one resistor 308. The fine resistor string 300 is attached across resistor 308 at nodes 304 and 306.

As shown in FIG. 3A, tap 332 is connected directly to node 310 in the fine resistor string voltage divider circuit 300. Tap 334 is not connected to node 312, but is connected towards the top of resistor 324 to provide a small amount of compensation. In other words, the voltage at tap 334 is adjusted downwardly from the voltage that appears at node 312 to compensate for the fact that the voltage at 312 is slightly higher than it should be. Tap 336 is connected at a slightly lower position on resistor 326. Similarly, tap 338 is connected to resistor 328 at even a lower position. Further, tap 340 is connected to resistor 330 at a still lower position. As can be seen, the taps 334, 336, 338 and 340 provide progressive compensation moving downwardly along the fine resistor string 300. The progressive compensation provided by the taps 334–340 reduces the DNL between each tap as well as the DNL between tap 340 and node 320.

Figure 3B:
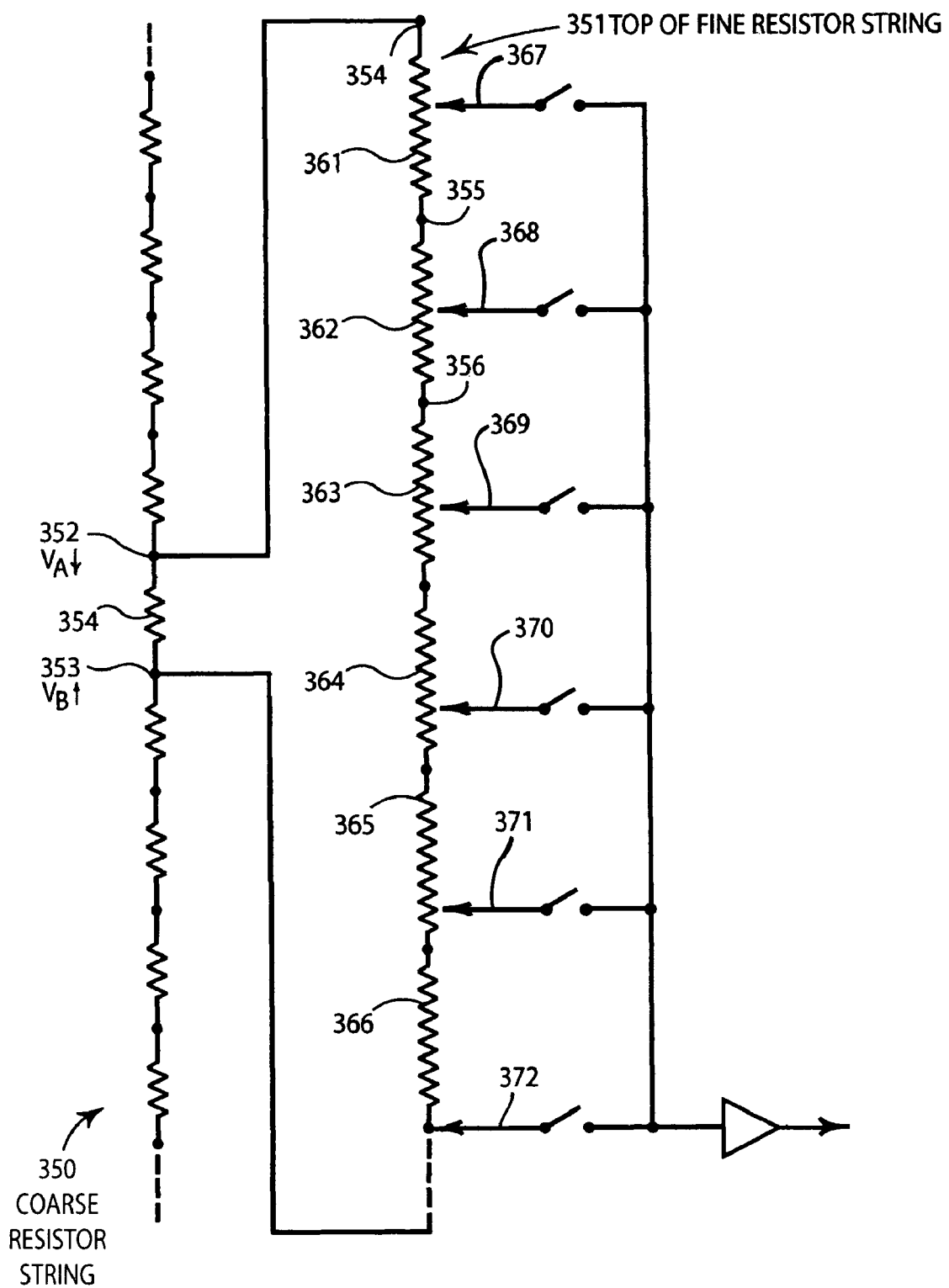

FIG. 3B illustrates an additional embodiment of the present invention. FIG. 3B illustrates compensation at the top of the fine resistor string 351, rather than at the bottom of the fine resistor string, as shown in FIGS. 2A, 2B and 3A. Only the top of the fine resistor string 351 is shown in FIG. 3B. Nodes 352 and 353 are attached across resistor 354 of the fine resistor string. As described above, when the fine resistor string is attached across resistor 354, the voltage $V_A$ at node 352 goes down, and the voltage $V_B$ at node 353 goes up. Hence, the voltage at node 354 is lower than it should be, and tap 367 taps resistor 361 at a position higher than node 355 to provide a higher voltage at tap 367. Similarly, each of the taps 368, 369, 370 and 371 provide a slightly lesser amount of compensation by tapping each of the resistors 362, 363, 364 and 365, respectively, at progressively lower positions on each of these resistors. In this fashion, the DNL between each of the taps 367–372 is distributed so as to reduce the amount of DNL between any two successive taps, in the same manner as described in FIG. 3A. The difference, however, between FIGS. 3A and 3B is that compensation is provided in FIG. 3B at the top of the fine resistor string 351, rather than the bottom of the fine resistor string 300, as shown in FIG. 3A.

FIGS. 2A, 2B and 3A illustrate an embodiment in which the output signal is shifted upwardly by one least significant bit (LSB) because the first tap is located at the top of the fine resistor string 208, at node 222, as illustrated in FIGS. 2A and 2B. Similarly, the embodiment illustrated in FIG. 3B is shifted downwardly by one least significant bit because tap 367, without compensation, would normally be connected to node 355.

Figure 3C:
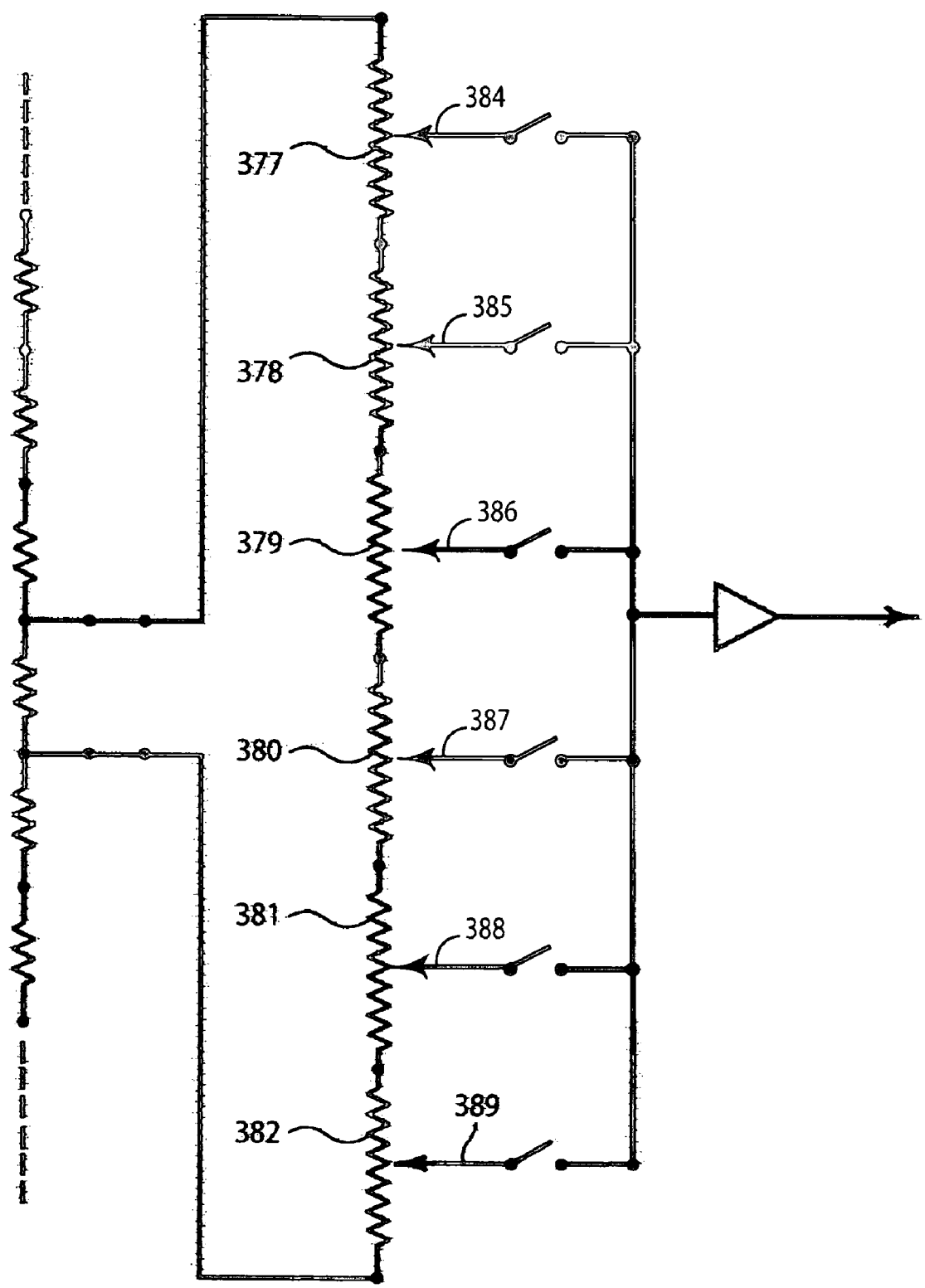

FIG. 3C illustrates the manner in which the fine resistor string can be tapped in the middle of each resistor to only shift the output signal by one-half of a least significant bit at both the top and the bottom of the fine resistor string. Hence, as shown in FIG. 3C, taps 384–389 tap each of the resistors 377–382 at the center positions.

Figure 3D:
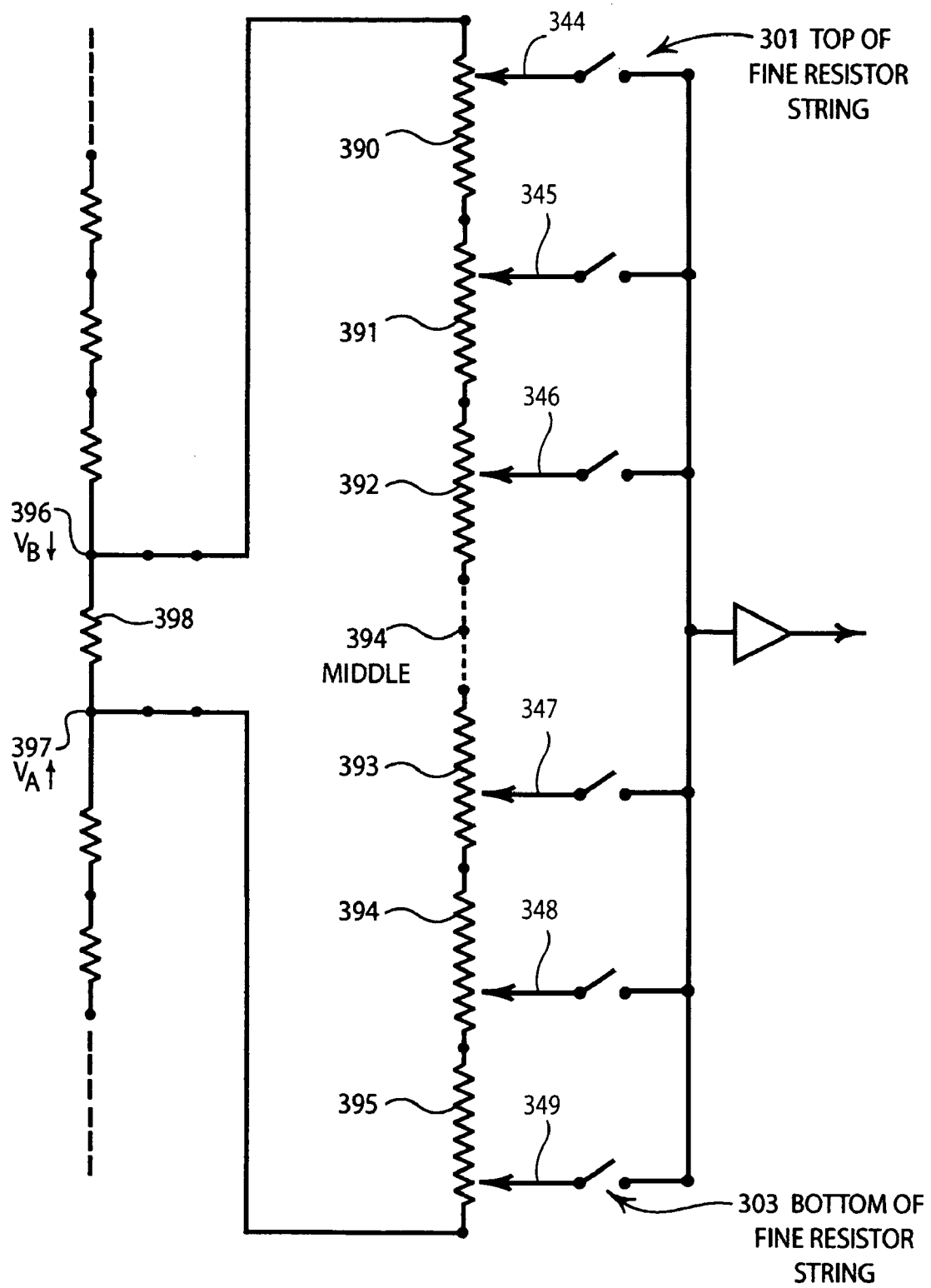

FIG. 3D illustrates the manner in which the embodiment of FIG. 3C can be altered to provide compensation. In the case of FIG. 3D, symmetrical compensation is provided at both the top of the time resistor string 301 and the bottom of the fine resistor string 303. As discussed above, when the fine resistor string is attached across resistor 398, the voltage $V_B$ at node 396 goes down and the voltage $V_A$ at node 397 goes up. Hence, the voltage at the top of the fine resistor string 301 is lower than it should be so that the tap 344 is connected at a higher position on resistor 390, than the center position of resistor 377, as shown in FIG. 3C. Similarly, tap 345 is also connected above the center position of the resistor 391, but not as high as the tap 344 on resistor 390. Similarly, tap 346 is tapped above the center point of resistor 392, but not as high as the tap 345 on resistor 391. Since $V_B$ goes down when the fine resistor string is attached in parallel to coarse resistor 398, the voltage changes at the top of the fine resistor string 301. Progressive tapping of the resistors 390–392 provides progressive compensation for the voltage change at the top of the fine resistor string, due to loading, that are the greatest at the ends of the fine resistor string. This structure spreads the DNL error at the top of the fine resistor string so that several nodes share the DNL error while simultaneously reducing the LSB shift to one-half of an LSB.

FIG. 3D also illustrates node 399, which represents the middle node of the fine resistor string of FIG. 3D. Tap 347 attaches to resistor 393 slightly below the midpoint, while tap 348 is attached farther below the midpoint of resistor 394. Tap 349 attaches even farther below the midpoint of resistor 395. Since the voltage $V_A$ goes up when the fine resistor string is attached in parallel to resistor 398, each of the taps 347, 348 and 349 are attached to resistors 393, 394 and 395 at progressively lower positions to compensate for $V_A$ going up. As can be seen from FIG. 3D, progressive and symmetrical compensation is provided at both the top of the fine resistor string 301 and the bottom of the fine resistor string 303.

Figure 4A:
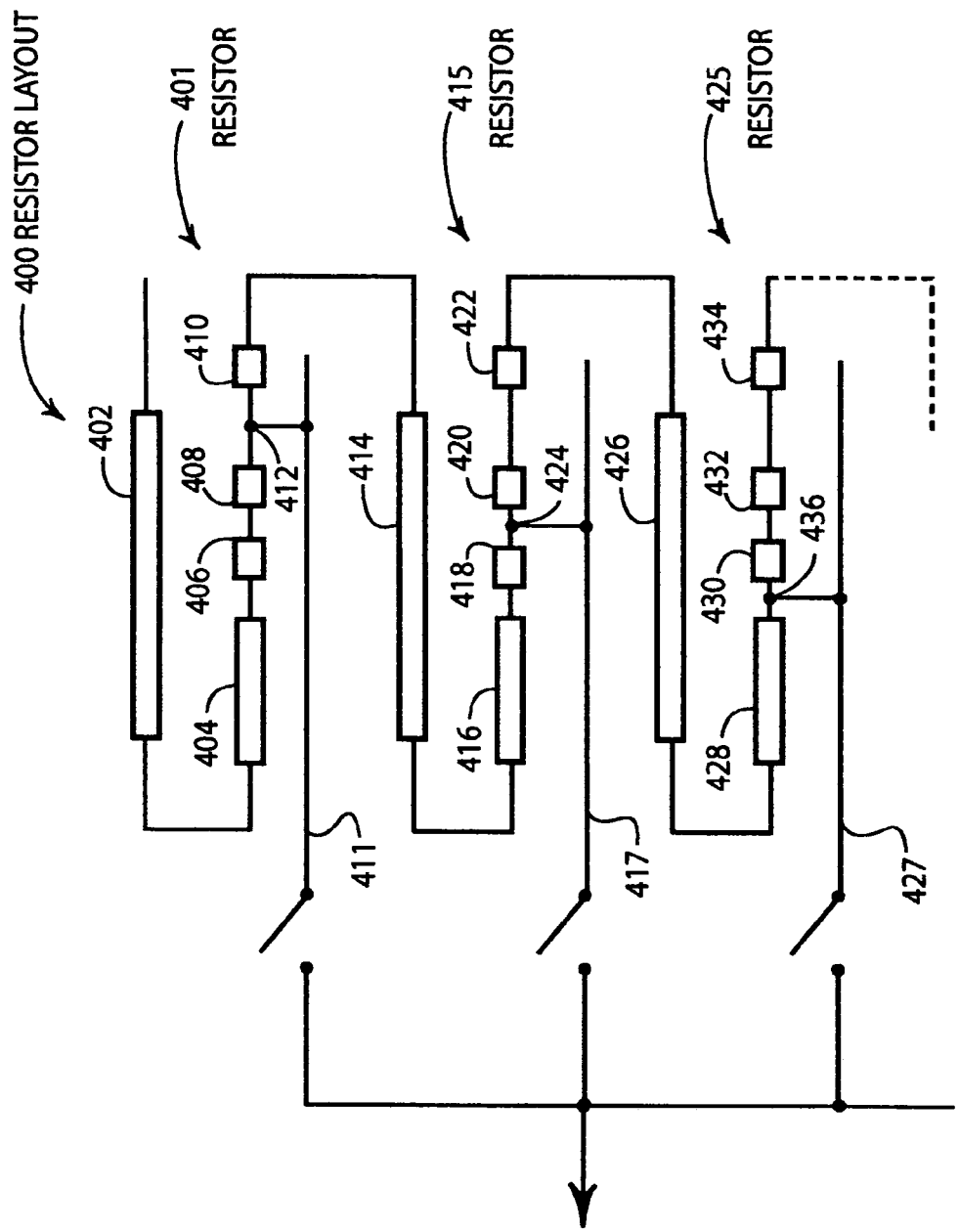
FIG. 4 is a schematic block diagram of a circuit layout for the fine resistor series string.

FIG. 4A illustrates one embodiment of a resistor layout 400 that can be used in accordance with the present invention. As shown in FIG. 4A, a first series of resistive elements 402, 404, 406, 408 and 410 are shown that comprise resistor 401. Each of the resistive elements has a size that is approximately proportional to the amount of resistance provided by each of the elements. Tap 411 is connected at node 412 between resistive element 408 and resistive element 410. In this fashion, the resistor 401 is tapped slightly downwardly from the top of the resistive element as shown in FIG. 3A. Similarly, resistor 415 includes resistive elements 414, 416, 418, 420 and 422. Tap 417 is connected to resistor 415 between resistive elements 418 and 420 at node 424. In this fashion, resistor 415 is tapped at a slightly lower position than tap 411 on resistor 401. Similarly, resistor 425 comprises resistive elements 426, 428, 430, 432 and 434. Tap 427 attaches to resistor 425 between resistive element 428 and resistive element 430 at node 436. In this fashion, resistor 425 is tapped at a slightly lower position than tap 417 on resistor 415. These tapping positions are similar to the various tapping positions that are shown in FIG. 3A.

Figure 4B:
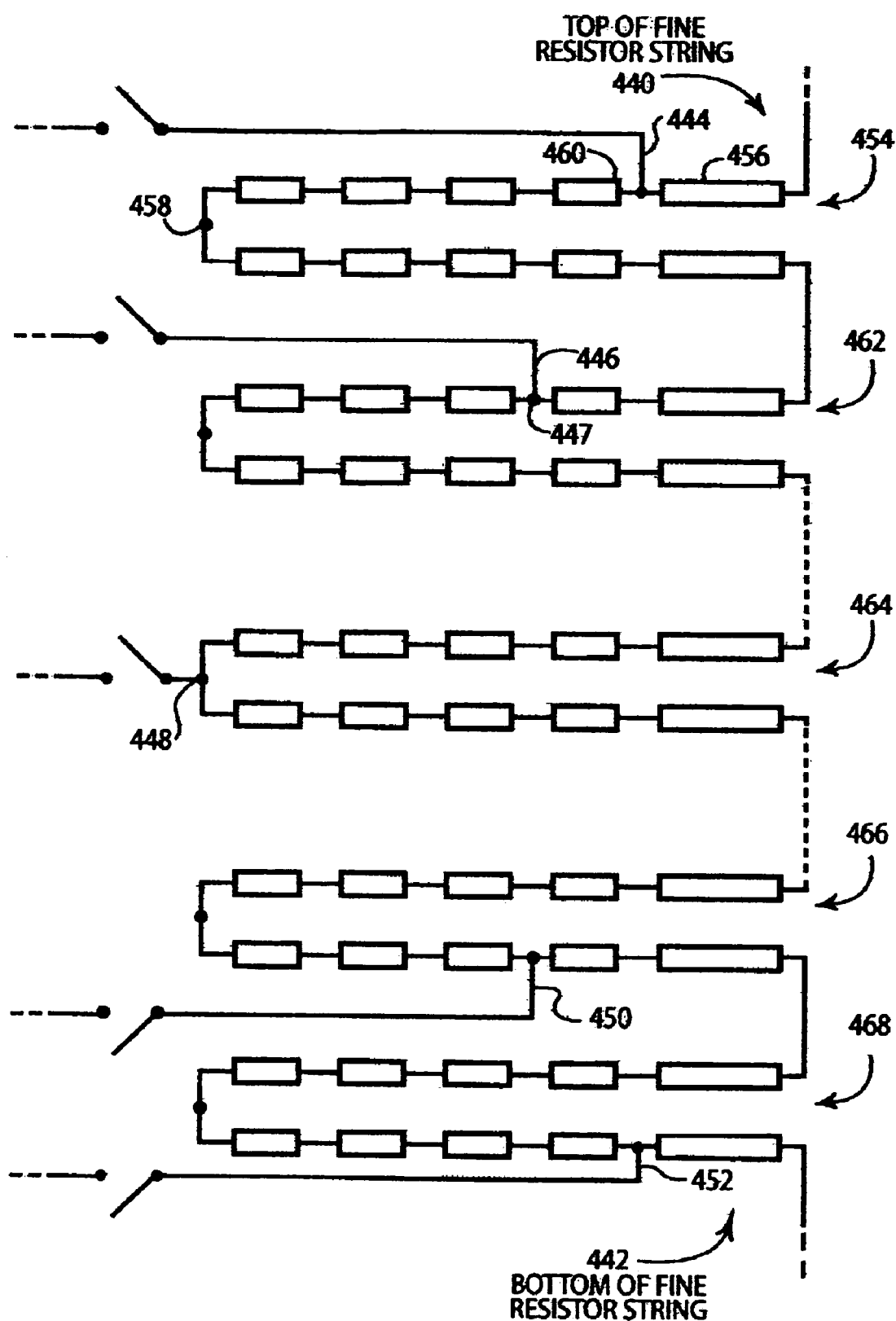

FIG. 4B shows another embodiment of a resistor layout that is suitable for use with the symmetrical compensation illustrated in FIG. 3D. As shown in FIG. 4B, resistor 454 corresponds to resistor 390 in FIG. 3D. As shown in FIG. 4B, tap 444 taps resistor 454 between the larger resistive element 456 and the first smaller resistive element 460. In this manner, the tap 444 is shifted by four smaller resistive elements from the midpoint 458 of resistor 454. Tap 446 taps resistor 462 at node 447 that is shifted one resistive element down from resistor 454. Resistor 464 constitutes one or more resistors that are in the center or towards the center of the fine resistor string for which no compensation is provided. Hence, tap 448 taps in the center of the resistive elements of resistor 464. Tap 450 taps resistor 466 two resistive elements from the bottom. Tap 452 taps resistor 468 one resistive element up from the bottom of resistor 468. Resistor 466 corresponds to resistor 394 of FIG. 3D, and resistor 468 corresponds to resistor 395 of FIG. 3D. As shown in FIG. 4B, each of the resistors can be layed out in the same fashion and simply tapped at a different location to provide the progressive compensation desired at both the top of the fine resistor string 440 and the bottom of the fine resistor string 442. This allows the design to be simplified in the layout process which reduces costs. Hence, symmetrical compensation can be provided at both the top of the fine resistor string 440 and the bottom of the fine resistor string 442 in a simple and elegant design layout. The number and size of the resistive elements of each of these resistors can be selected to provide the desired symmetrical compensation.

Figure 5:
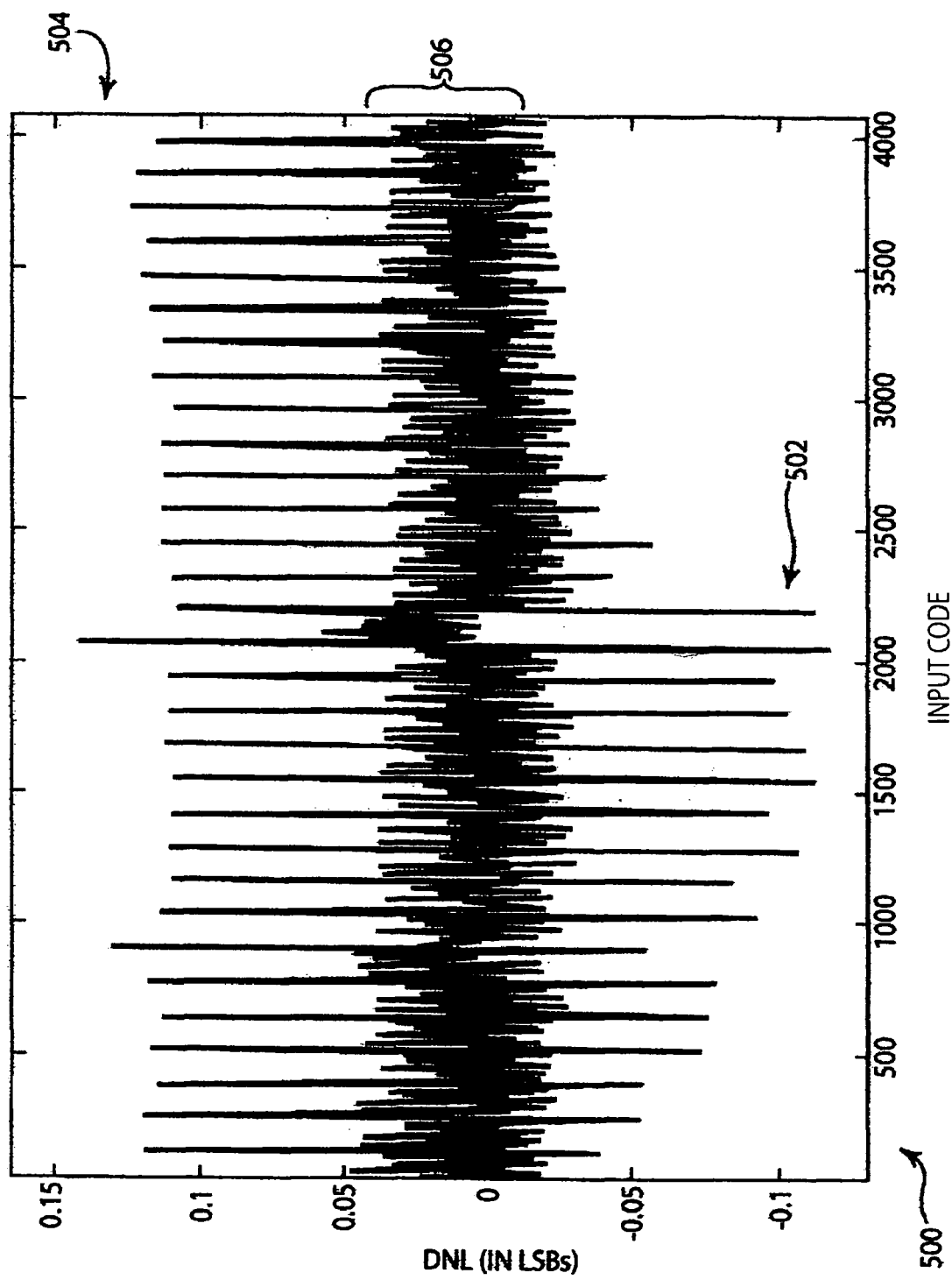
FIGS. 5 and 6 are graphs of test results of prototypes of the present invention.

FIG. 5 is a graph of actual test results of DNL versus the digital input code for a prototype unit. The prototype unit is a 12-bit DAC with a coarse string of 32 taps and a fine string of 128 taps. Spikes 502 and 504 comprise the systematic DNL, while spikes 506 comprises random error. The large positive spikes actually comprise three spikes that are close together.

Figure 6:
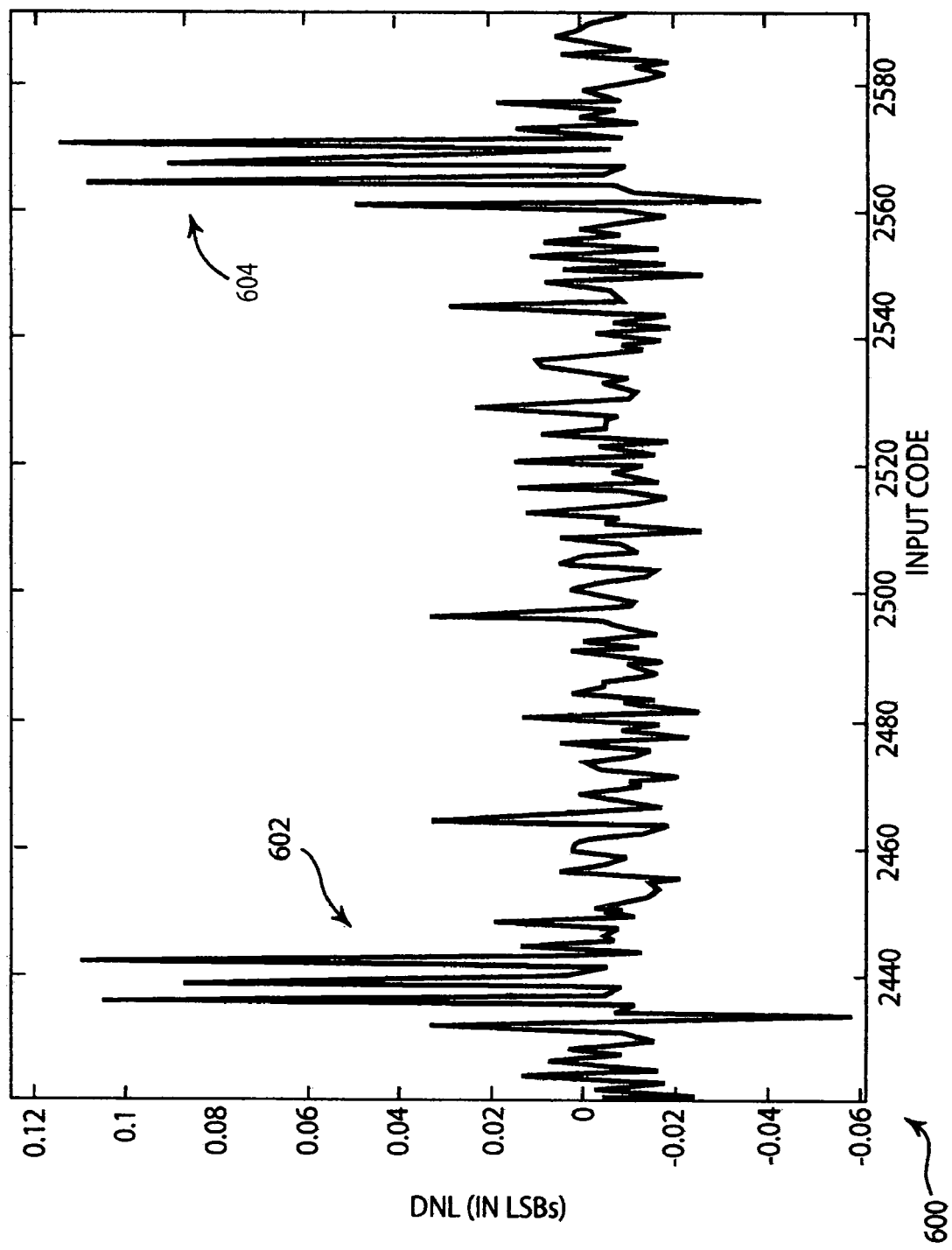

FIG. 6 is a graph 600 which is a close-up view of the FIG. 5 test results that shows DNL versus the digital input code. Spikes 602 and 604 comprise three spikes that have spread the DNL error over three taps. By spreading the DNL error over three separate taps, three separate spikes on the order of 0.1 to 0.12 DNL are produced, rather than one single spike that may be on the order of 0.3 to 0.36 DNL. Hence, the progressive distribution of the DNL over several taps reduces the DNL that can occur on a single tap.

The present invention therefore provides a unique manner of compensating and minimizing digital-to-analog converter differential nonlinearity by compensating for resistor loading by adjusting taps in the fine resistor string. Distribution of the DNL error over several taps reduces the DNL that may occur on any single tap. In this fashion, monoticity can be insured and minimal DNL can be achieved.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of converting a digital code to an analog signal comprising:
   providing a two-stage resistor divider circuit having a coarse resistor string and a fine resistor string;
   tapping said fine resistor string in at least one position on said fine resistor string that provides compensation for resistive loading created by connecting said fine resistor string in parallel with at least one resistor in said coarse resistor string.

2. The method of claim 1 wherein tapping said fine resistor string further comprises:
   tapping a plurality of resistors in said fine resistor string to provide progressively higher resistance between taps at one end of said fine resistor string.

3. The method of claim 1 wherein tapping said fine resistor string further comprises:
   tapping a plurality of resistors in said fine resistor string to provide progressively higher resistance between taps at two ends of said fine resistor string.

4. The method of claim 1 wherein providing said two-stage resistor divider circuit further comprises:
   providing a fine resistor string that includes a plurality of resistors that have a plurality of resistive elements.

5. The method of claim 2 wherein providing said two-stage resistor divider circuit further comprises:
   providing a fine resistor string that includes a plurality of resistors that have a plurality of resistive elements.

6. The method of claim 3 wherein providing said two-stage resistor divider circuit further comprises:
   providing a fine resistor string that includes a plurality of resistors that have a plurality of resistive elements.

7. The method of claim 1 wherein tapping said fine resistor string further comprises:
   tapping a single resistor that is located at one end of said fine resistor string.

8. The method of claim 2 wherein tapping said fine resistor string further comprises:
   tapping a plurality of resistors in said fine resistor string to provide progressively higher resistance between taps at a lower voltage end of said fine resistor string.

9. The method of claim 2 wherein tapping said fine resistor string further comprises:
   tapping a plurality of resistors in said fine resistor string to provide progressively higher resistance between taps at a higher voltage end of said fine resistor string.

10. The method of claim 3 wherein tapping said fine resistor string further comprises:
    tapping a plurality of resistors in said fine resistor string to provide progressively higher resistance between taps at both ends of said fine resistor string.

11. A digital-to-analog converter that reduces differential non-linearity comprising:
    a coarse resistor string, connected between two potential voltages, having a plurality of coarse resistors;
    a fine resistor string;
    a plurality of switches that connect said fine resistor string in parallel with at least one coarse resistor of said plurality of coarse resistors;
    a tap that connects to a fine resistor of said plurality of fine resistors in a position that provides compensation for resistive loading created by connecting said fine resistor string in parallel with said at least one coarse resistor.

12. The digital-to-analog converter at claim 11 wherein said fine resistor string includes a plurality of fine resistors having a plurality of resistive elements and a plurality of connection nodes between said plurality of resistive elements.

13. The digital-to-analog converter of claim 12 further comprising:
    a plurality of additional taps that connect to said plurality of connection nodes at positions that provide progressively higher resistance between said plurality of taps.

14. The digital-to-analog converter of claim 13 wherein said plurality of additional taps connect to said plurality of connection nodes at one end of said fine resistor string.

15. The digital-to-analog converter of claim 14 wherein said plurality of additional taps connect to said plurality of connection nodes at a high voltage end of said fine resistor string.

16. The digital-to-analog converter of claim 14 wherein said plurality of additional taps connect to said plurality of connection nodes at a low voltage and of said fine resistor string.

17. The digital-to-analog converter of claim 14 wherein said plurality of additional taps connect to said plurality of connection nodes at both ends of said fine resistor string.

18. The digital-to-analog converter of claim 11 wherein said fine resistor string includes one fine resistor having a plurality of resistive elements and a plurality of connection nodes between said plurality of resistive elements, said tap being connected to one connection node of said plurality of connection nodes.

* * * * *